United States Patent
Tan et al.

(10) Patent No.: US 10,685,836 B2
(45) Date of Patent: *Jun. 16, 2020

(54) ETCHING SUBSTRATES USING ALE AND SELECTIVE DEPOSITION

(71) Applicant: Lam Research Corporation, Fremont, CA (US)

(72) Inventors: Samantha Tan, Fremont, CA (US);
Jengyi Yu, San Ramon, CA (US);
Richard Wise, Los Gatos, CA (US);
Nader Shamma, Cupertino, CA (US);
Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/361,083

(22) Filed: Mar. 21, 2019

(65) Prior Publication Data

US 2019/0244805 A1    Aug. 8, 2019

Related U.S. Application Data

(63) Continuation of application No. 15/494,245, filed on Apr. 21, 2017, now Pat. No. 10,269,566.
(Continued)

(51) Int. Cl.
*H01L 21/027* (2006.01)
*H01L 21/3105* (2006.01)
(Continued)

(52) U.S. Cl.
CPC .......... *H01L 21/0273* (2013.01); *G03F 7/427* (2013.01); *H01J 37/3244* (2013.01);
(Continued)

(58) Field of Classification Search
None
See application file for complete search history.

(56) References Cited

U.S. PATENT DOCUMENTS

| | | |
|---|---|---|
| 4,592,801 A | 6/1986 | Hara et al. |
| 4,756,794 A | 7/1988 | Yoder |

(Continued)

FOREIGN PATENT DOCUMENTS

| | | |
|---|---|---|
| CN | 104249070 | 12/2014 |
| JP | 06-326060 A | 11/1994 |

(Continued)

OTHER PUBLICATIONS

U.S. Office Action dated Apr. 10, 2019 issued in U.S. Appl. No. 15/841,205.
(Continued)

*Primary Examiner* — Shamim Ahmed
(74) *Attorney, Agent, or Firm* — Beyer Law Group LLP

(57) ABSTRACT

Methods of and apparatuses for processing substrates having carbon-containing material using atomic layer etch and selective deposition are provided. Methods involve exposing a carbon-containing material on a substrate to an oxidant and igniting a first plasma to modify a surface of the substrate and exposing the modified surface to a second plasma at a bias power to remove the modified surface. Methods also involve selectively depositing a second carbon-containing material onto the substrate using a precursor having a chemical formula of $C_xH_y$, where x and y are integers greater than or equal to 1. ALE and selective deposition may be performed without breaking vacuum.

20 Claims, 13 Drawing Sheets

Related U.S. Application Data

(60) Provisional application No. 62/329,916, filed on Apr. 29, 2016.

(51) Int. Cl.
    B44C 1/22      (2006.01)
    H01J 37/32     (2006.01)
    H01L 21/3065   (2006.01)
    H01L 21/308    (2006.01)
    H01L 21/311    (2006.01)
    G03F 7/42      (2006.01)
    H01L 21/02     (2006.01)

(52) U.S. Cl.
    CPC .. *H01J 37/32183* (2013.01); *H01J 37/32899* (2013.01); *H01L 21/02115* (2013.01); *H01L 21/3065* (2013.01); *H01L 21/3086* (2013.01); *H01L 21/31056* (2013.01); *H01L 21/31058* (2013.01); *H01L 21/31122* (2013.01); *H01L 21/31138* (2013.01); *H01J 2237/334* (2013.01)

(56) References Cited

U.S. PATENT DOCUMENTS

| | | |
|---|---|---|
| 6,022,806 A | 2/2000 | Sato et al. |
| 6,177,353 B1 | 1/2001 | Gutsche et al. |
| 6,448,192 B1 | 9/2002 | Kaushik |
| 6,482,745 B1 | 11/2002 | Hwang |
| 6,562,700 B1 | 5/2003 | Gu et al. |
| 7,049,226 B2 | 5/2006 | Chung et al. |
| 7,196,955 B2 | 3/2007 | Nickel |
| 7,416,989 B1 | 8/2008 | Liu et al. |
| 7,759,239 B1 | 7/2010 | Lin et al. |
| 7,795,148 B2 | 9/2010 | Brown |
| 7,943,527 B2 | 5/2011 | Kumar et al. |
| 8,110,503 B2 | 2/2012 | Kumar et al. |
| 8,227,344 B2 | 7/2012 | Selsley et al. |
| 8,252,194 B2 | 8/2012 | Kiehlbauch et al. |
| 8,808,561 B2 | 8/2014 | Kanarik |
| 8,883,028 B2 | 11/2014 | Kanarik |
| 8,993,352 B2 | 3/2015 | Nishimura et al. |
| 9,130,158 B1 | 9/2015 | Shen et al. |
| 9,240,315 B1 | 1/2016 | Hsieh et al. |
| 9,257,638 B2 | 2/2016 | Tan et al. |
| 9,449,843 B1 | 9/2016 | Korolik et al. |
| 9,576,811 B2 | 2/2017 | Kanarik et al. |
| 9,806,252 B2 | 10/2017 | Tan et al. |
| 9,837,312 B1 | 12/2017 | Tan et al. |
| 9,984,858 B2 | 5/2018 | Kanarik et al. |
| 9,991,128 B2 | 6/2018 | Tan et al. |
| 9,997,371 B1 | 6/2018 | Agarwal et al. |
| 10,056,268 B2 | 8/2018 | Li |
| 10,096,487 B2 | 10/2018 | Yang et al. |
| 10,269,566 B2 | 4/2019 | Tan et al. |
| 10,304,659 B2 | 5/2019 | Kanarik et al. |
| 2001/0053585 A1 | 12/2001 | Kikuchi et al. |
| 2002/0009883 A1 | 1/2002 | Ogure et al. |
| 2002/0051728 A1 | 5/2002 | Sato et al. |
| 2002/0058409 A1 | 5/2002 | Lin et al. |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0006222 A1 | 1/2005 | Ding et al. |
| 2005/0061234 A1 | 3/2005 | Li et al. |
| 2005/0098440 A1 | 5/2005 | Kailasam et al. |
| 2005/0112901 A1 | 5/2005 | Ji et al. |
| 2005/0208754 A1 | 9/2005 | Kostamo et al. |
| 2006/0009040 A1 | 1/2006 | Tomioka et al. |
| 2006/0172530 A1 | 8/2006 | Cheng et al. |
| 2006/0194435 A1 | 8/2006 | Nishimura et al. |
| 2007/0049036 A1 | 3/2007 | Huang |
| 2007/0095367 A1 | 5/2007 | Wang et al. |
| 2007/0202254 A1 | 8/2007 | Ganguli et al. |
| 2007/0238301 A1 | 10/2007 | Cabral et al. |
| 2007/0246442 A1 | 10/2007 | America et al. |
| 2009/0020884 A1 | 1/2009 | Lee et al. |
| 2009/0075472 A1 | 3/2009 | Arnold et al. |
| 2009/0226611 A1 | 9/2009 | Suzuki et al. |
| 2009/0256220 A1 | 10/2009 | Horng et al. |
| 2010/0048029 A1 | 2/2010 | Kumar et al. |
| 2010/0060539 A1 | 3/2010 | Suetsuna et al. |
| 2011/0117678 A1 | 5/2011 | Varadarajan et al. |
| 2011/0130011 A1 | 6/2011 | Sasajima et al. |
| 2011/0139748 A1 | 6/2011 | Donnelly et al. |
| 2011/0200762 A1 | 8/2011 | Kumar et al. |
| 2011/0212274 A1 | 9/2011 | Selsley et al. |
| 2012/0009785 A1 | 1/2012 | Chandrashekar et al. |
| 2012/0100308 A1 | 4/2012 | Milligan et al. |
| 2012/0115329 A1 | 5/2012 | Chandrashekar et al. |
| 2012/0276657 A1 | 11/2012 | Joubert et al. |
| 2013/0105303 A1 | 5/2013 | Lubomirsky et al. |
| 2013/0168354 A1 | 7/2013 | Kanarik |
| 2014/0120688 A1 | 5/2014 | Booth, Jr. et al. |
| 2014/0134847 A1 | 5/2014 | Seya |
| 2014/0193979 A1 | 7/2014 | Or et al. |
| 2015/0017812 A1 | 1/2015 | Chandrasekharan et al. |
| 2015/0037972 A1 | 2/2015 | Danek et al. |
| 2015/0041809 A1 | 2/2015 | Arnold et al. |
| 2015/0064917 A1 | 3/2015 | Somervell et al. |
| 2015/0084156 A1 | 3/2015 | Ravasio et al. |
| 2015/0170957 A1 | 6/2015 | Tsao |
| 2015/0214474 A1 | 7/2015 | Nishimura et al. |
| 2015/0270140 A1 | 9/2015 | Gupta et al. |
| 2016/0013063 A1 | 1/2016 | Ranjan et al. |
| 2016/0020152 A1 | 1/2016 | Posseme |
| 2016/0064244 A1 | 3/2016 | Agarwal et al. |
| 2016/0135274 A1 | 5/2016 | Fischer et al. |
| 2016/0203995 A1 | 7/2016 | Kanarik et al. |
| 2016/0308112 A1 | 10/2016 | Tan et al. |
| 2016/0314985 A1 | 10/2016 | Yang et al. |
| 2016/0358782 A1 | 12/2016 | Yang et al. |
| 2016/0379824 A1 | 12/2016 | Wise et al. |
| 2017/0040214 A1 | 2/2017 | Lai et al. |
| 2017/0053810 A1 | 2/2017 | Yang et al. |
| 2017/0069462 A1 | 3/2017 | Kanarik et al. |
| 2017/0125256 A1 | 5/2017 | Lee et al. |
| 2017/0178917 A1 | 6/2017 | Kamp et al. |
| 2017/0186621 A1 | 6/2017 | Zaitsu |
| 2017/0229311 A1 | 8/2017 | Tan et al. |
| 2017/0229314 A1 | 8/2017 | Tan et al. |
| 2017/0243755 A1 | 8/2017 | Tapily |
| 2017/0256416 A1 | 9/2017 | Fischer et al. |
| 2017/0316935 A1 | 11/2017 | Tan et al. |
| 2018/0019387 A1 | 1/2018 | Tan et al. |
| 2018/0174860 A1 | 6/2018 | Kanarik |
| 2018/0233325 A1 | 8/2018 | Kanarik et al. |
| 2018/0308695 A1 | 10/2018 | LaVoie et al. |
| 2018/0312973 A1 | 11/2018 | Agarwal et al. |
| 2018/0327913 A1 | 11/2018 | Lansalot-Matras et al. |
| 2018/0337046 A1 | 11/2018 | Shamma et al. |
| 2018/0350624 A1 | 12/2018 | Kanarik et al. |
| 2019/0131130 A1 | 5/2019 | Smith et al. |

FOREIGN PATENT DOCUMENTS

| | | |
|---|---|---|
| JP | 2016-532311 A | 10/2016 |
| KR | 10-2016-0136303 | 11/2016 |
| WO | WO 2011/081921 A2 | 7/2011 |
| WO | WO 2016/100873 A1 | 6/2016 |
| WO | WO 2017/099718 A1 | 6/2017 |

OTHER PUBLICATIONS

U.S. Final Office Action dated Mar. 8, 2019 issued in U.S. Appl. No. 15/654,612.
U.S. Notice of Allowance dated Aug. 1, 2019 issued in U.S. Appl. No. 15/654,612.
International Preliminary Report on Patentability dated Jul. 4, 2019 issued in Application No. PCT/US2017/066470.
U.S. Notice of Allowance dated Apr. 4, 2019 issued in U.S. Appl. No. 15/952,834.

(56) References Cited

OTHER PUBLICATIONS

U.S. Final Office Action dated Jul. 25, 2019 issued in U.S. Appl. No. 15/799,675.
U.S. Office Action dated Nov. 29, 2017 issued in U.S. Appl. No. 15/421,189.
U.S. Notice of Allowance dated Apr. 25, 2018 issued in U.S. Appl. No. 15/421,189.
U.S. Office Action dated Apr. 19, 2018 issued in U.S. Appl. No. 15/494,245.
U.S. Notice of Allowance dated Dec. 13, 2018 issued in U.S. Appl. No. 15/494,245.
U.S. Notice of Allowance dated Oct. 6, 2017 issued in U.S. Appl. No. 15/582,359.
U.S. Notice of Allowance dated Jan. 26, 2018 issued in U.S. Appl. No. 15/582,359.
U.S. Office Action dated Aug. 10, 2018 issued in U.S. Appl. No. 15/654,612.
International Search Report and Written Opinion dated Apr. 5, 2018 issued in Application No. PCT/US2017/066470.
International Search Report and Written Opinion dated Nov. 26, 2018 issued in Application No. PCT/US18/42024.
International Search Report and Written Opinion dated Oct. 16, 2018 issued in Application No. PCT/US2018/032783.
Faraz et al., (2015) "Atomic Layer Etching: What Can We Learn from Atomic Layer Deposition?," ECS Journal of Solid State Science and Technology, 4(6):N5023-N5032.
Kanarik et al. (Aug. 2018) "Atomic Layer Etching: Rethinking the Art of Etch" The Journal of Physical Chemistry Letters, vol. 9, pp. 4814-4821. <doi:10.1021/acs.jpclett.8b00997>.
Kanarik et al., (Mar./Apr. 2015) "Overview of atomic layer etching in the semiconductor industry," J. Vac. Sci. Technol. A, 33(2):020802-1-020802-14.
Kanarik et al., (Sep./Oct. 2017) "Predicting synergy in atomic layer etching," J. Vac. Sci. Technol. A,35(5):05C302-1 through 05C302-7.
U.S. Office Action dated Aug. 7, 2017 issued in U.S. Appl. No. 15/253,481.
U.S. Office Action dated May 5, 2016 issued in U.S. Appl. No. 14/749,285.
U.S. Final Office Action dated Sep. 23, 2016 issued in U.S. Appl. No. 14/749,285.
U.S. Office Action dated Feb. 17, 2017 issued in U.S. Appl. No. 14/749,285.
U.S. Final Office Action dated Mar. 30, 2017 issued in U.S. Appl. No. 14/749,285.
U.S. Office Action dated Aug. 11, 2017 issued in U.S. Appl. No. 14/749,285.
U.S. Notice of Allowance dated Sep. 29, 2017 issued in U.S. Appl. No. 14/749,285.
U.S. Office Action dated Nov. 28, 2016 issued in U.S. Appl. No. 14/749,291.
U.S. Notice of Allowance dated Jun. 30, 2017 issued in U.S. Appl. No. 14/749,291.
U.S. Office Action dated Jul. 1, 2016 issued in U.S. Appl. No. 14/830,683.
U.S. Final Office Action dated Feb. 7, 2017 issued in U.S. Appl. No. 14/830,683.
U.S. Office Action dated Jul. 25, 2017 issued in U.S. Appl. No. 14/830,683.
U.S. Office Action dated Aug. 25, 2017 issued in U.S. Appl. No. 15/239,138.
U.S. Final Office Action dated Jan. 25, 2018 issued in U.S. Appl. No. 15/253,481.
U.S. Notice of Allowance dated Feb. 12, 2018 issued in U.S. Appl. No. 15/253,481.
U.S. Office Action dated Jan. 2, 2019 issued in U.S. Appl. No. 15/952,834.
U.S. Office Action dated Oct. 10, 2018 issued in U.S. Appl. No. 15/423,486.
U.S. Office Action dated Feb. 26, 2019 issued in U.S. Appl. No. 15/423,486.
U.S. Office Action dated Mar. 24, 2017 issued in U.S. Appl. No. 15/286,421.
U.S. Notice of Allowance dated Sep. 28, 2017 issued in U.S. Appl. No. 15/286,421.
U.S. Notice of Allowance [Supplemental Notice of Allowability] dated Oct. 26, 2017 issued in U.S. Appl. No. 15/286,421.
International Search Report and Written Opinion dated Feb. 25, 2019 issued in Application No. PCT/US2018/055065.
Boullart et al. (Mar. 29, 2013) "STT MRAM patterning challenges," Proc. SPIE, Advanced Etch Technology for Nanopatterning II, Proc. of SPIE 8685:86850F-1-86850F-9 [Retrieved on Jun. 2, 2015 from http://proceedings.spiedigitallibrary.org].
Carver et al. (Feb. 20, 2015) "Atomic Layer Etching: An Industry Perspective," ECS Journal of Solid State Science and Technology,4(6):N5005-N5009.
Ditizio, Robert and Werbaneth, Paul, Tegal Corporation and Zhu, Jian-Gang, Carnegie Mellon University (Jan. 2004) "Cell Shape and Patterning Considerations for Magnetic Random Access Memory (MRAM) Fabrication," Reprinted with permission from Semiconductor Manufacturing Magazine, 7 pp.
Jiang et al. (1998) "Complexes Containing Unbridged Dative Metal-Metal Bonds and the Strong Acceptor $Ru(CO)_3(SiCl_3)_2$ Moiety. Comments on the Transition Metal to Silicon Bond," Organometallics, 17(26):5810-5819.
Kim et al. (Nov./Dec. 2013) "Atomic layer etching removal of damaged layers in a contact hole for low sheet resistance," J. Vac. Sci. Technol. A, 31(6):061302-1-061302-7.
Lee et al. (2015) "Atomic Layer Etching of $Al_2O_3$ Using Sequential, Self-Limiting Thermal Reactions with $Sn(acac)_2$ and Hydrogen Fluoride," $^{ACS}$NANO,9(2):2061-2070.
Moroz, Paul (Jul. 1-2, 2015) "Numerical Simulation of Atomic Layer Etching," Atomic Layer Etching Workshop, Portland, Oregon, USA; Tokyo Electron U.S. Holdings, Inc., 15pp.
Park, S.D. et al., (Sep. 22, 2005) "Surface Roughness Variation during Si Atomic Layer Etching by Chlorine Adsorption Followed by an Ar Neutral Beam Irradiation," Electrochemical and Solid-State Letters, 8(11):C177-C179, 1 page. [Abstract Only].
Pomeroy, R.K. and Wijesekera, K.S. (1980) "Preparation and derivatives of cis-$M(CO)_4(SiCl_3)_2$ (M=FE, RU, OS)," Inorg. Chem., 19(12):3729-3735.
Schmitt et al. (2006) "Synthesis and Properties of Single-Crystal FeSi Nanowires," Nano Lett., 6(8):1617-1621.
Schmitt et al. (Feb. 1, 2008) "Chemical Synthesis and Magnetotransport of Magnetic Semiconducting $Fe_{1-x}Co_xSi$ Alloy Nanowires," Nano Lett., 8(3):810-815.
Wolf, S. and Tauber, R.N. (1986) "Silicon Processing for the VLSI Era," vol. 1-Process Technology, Lattice Press, pp. 542-557.
U.S. Appl. No. 15/799,675, filed Oct. 31, 2017, Smith et al.
U.S. Office Action dated Jan. 14, 2019 issued in U.S. Appl. No. 15/799,675.
Chinese Office Action from Chinese Application No. 201710291502.8 dated Mar. 25, 2020.

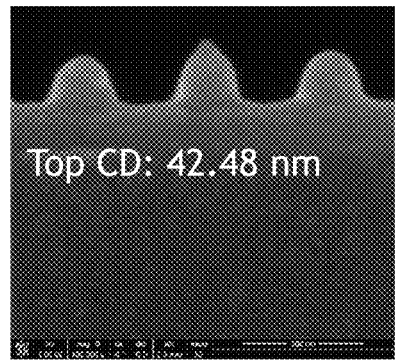
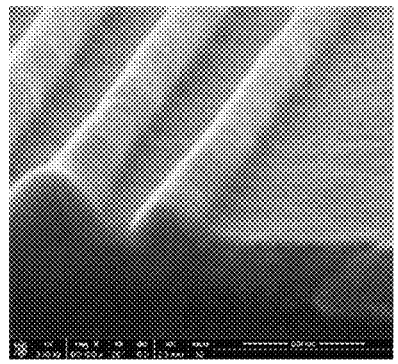
FIG. 11A    FIG. 11B
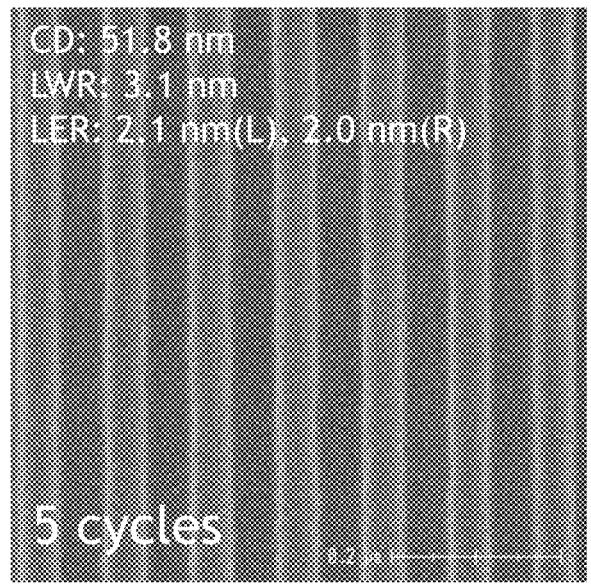
FIG. 11C

ETCHING SUBSTRATES USING ALE AND SELECTIVE DEPOSITION

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Patterning methods are critical to semiconductor processing. In particular, extreme ultraviolet (EUV) lithography has been explored to extend lithographic technology beyond its optical limits and replace current photolithography methods to pattern small critical dimension features. Current EUV lithography methods result in poor edge roughness and weak patterns that may ultimately render the substrate useless.

SUMMARY

Provided herein are methods and apparatuses for processing semiconductor substrates. One aspect involves a method of processing substrates, the method including: (a) exposing a substrate including a first carbon-containing material to an oxidant and igniting a first plasma with a first bias power to modify a surface of the first carbon-containing material; and (b) exposing the modified layer to a second plasma at a second bias power and for a duration sufficient to remove the modified surface without sputtering. In various embodiments, the method also includes (c) selectively depositing a second carbon-containing material on the substrate to fill crevices on the first carbon-containing material. In various embodiments, the method also includes repeating (a)-(c) in cycles. In various embodiments, the second bias power may be between about 30V and about 100V.

In some embodiments, the oxidant is a strong oxidant. For example, the strong oxidant may be oxygen. In various embodiments, the first plasma is generated using a plasma power between about 15 W and about 500 W. The first bias power may be between about 5V and 50V.

In some embodiments, the oxidant is a weak oxidant. For example, the weak oxidant may be any one or more of carbon dioxide, carbon monoxide, sulfur dioxide, nitric oxide, nitrogen, and ammonia. In some embodiments, the first plasma is generated using a plasma power between about 30 W and about 500 W. The first bias power may be between about 30V and about 100V.

In various embodiments, selectively depositing the second carbon-containing material on the substrate includes applying a self-bias at a power between about 5V and about 15V and igniting a plasma using a plasma power between about 30 W and about 500 W. In some embodiments, selectively depositing the second carbon-containing material on the substrate also includes introducing methane. Selectively depositing the second carbon-containing material on the substrate may also include introducing a diluent such as any one or more of nitrogen, helium, argon, hydrogen, and combinations thereof.

In various embodiments, the first carbon-containing material is any one or more of photoresist, amorphous carbon, and graphene. In some embodiments, the first carbon-containing material is a photoresist patterned by extreme ultraviolet lithography.

In some embodiments, (c) includes exposing the substrate to methane to adsorb a layer of methane to the surface of the first carbon-containing material and exposing the substrate to a third plasma.

The third plasma may be generated by introducing an inert gas such as any one or more of helium, hydrogen, nitrogen, argon, and neon and igniting a plasma.

In various embodiments, exposing the substrate including the first carbon-containing material to the oxidant also includes exposing the substrate to a diluent inert gas such as any one or more of helium, argon, neon, krypton, and xenon.

The second plasma in (b) may be generated by introducing an inert gas such as any one or more of hydrogen, helium, nitrogen, argon, and neon and igniting a plasma.

In various embodiments, the method also includes purging a chamber housing the substrate between performing (a) and (b) to remove excess oxidant from the chamber.

In some embodiments, the method also includes repeating (a) and (b) in cycles.

The substrate may rest on a pedestal set to a temperature between about 0° C. and about 120° C.

Another aspect involves an apparatus for processing a substrate, the apparatus including: one or more process chambers, each process chamber including a chuck; one or more gas inlets into the process chambers and associated flow control hardware; and a controller having at least one processor and a memory, such that the at least one processor and the memory are communicatively connected with one another, the at least one processor is at least operatively connected with the flow control hardware, and the memory stores computer executable instructions for controlling the at least one processor to at least control the flow control hardware by: (i) introducing an oxidant to the process chamber and igniting a first plasma at a first bias power; and (ii) introducing a first inert gas and igniting a second plasma at a second bias power such that (i) and (ii) are performed without breaking vacuum.

In various embodiments, the memory also includes instructions for (iii) introducing a carbon-containing precursor to the process chamber to form an adsorbed layer of the carbon-containing precursor to the surface of a substrate housed in the one or more process chambers; and (iv) introducing a second inert gas and igniting a third plasma.

In various embodiments, the instructions further include instructions for turning on a self-bias at a power between about 5V and about 15V when introducing the carbon-containing precursor in (iii).

In various embodiments, the instructions further include instructions for introducing a diluent selected from the group consisting of nitrogen, helium, argon, hydrogen, and combinations thereof.

In various embodiments, the oxidant is oxygen. The first bias power may be between about 5V and about 50V. In various embodiments, the first plasma is set to a plasma power between about 15 W and 500 W.

In various embodiments, the oxidant is any one or more of carbon dioxide, carbon monoxide, sulfur dioxide, nitric oxide, nitrogen, and ammonia. In some embodiments, the first bias power is between about 30V and about 100V. In some embodiments, the first plasma is set to a plasma power between about 30 W and 500 W.

These and other aspects are described further below with reference to the drawings.

BRIEF DESCRIPTION OF THE DRAWINGS

FIGS. 10A-10C and 11A-11C are various view of a substrate from an experiment conducted in accordance with certain disclosed embodiments.

DETAILED DESCRIPTION

Figure 1:
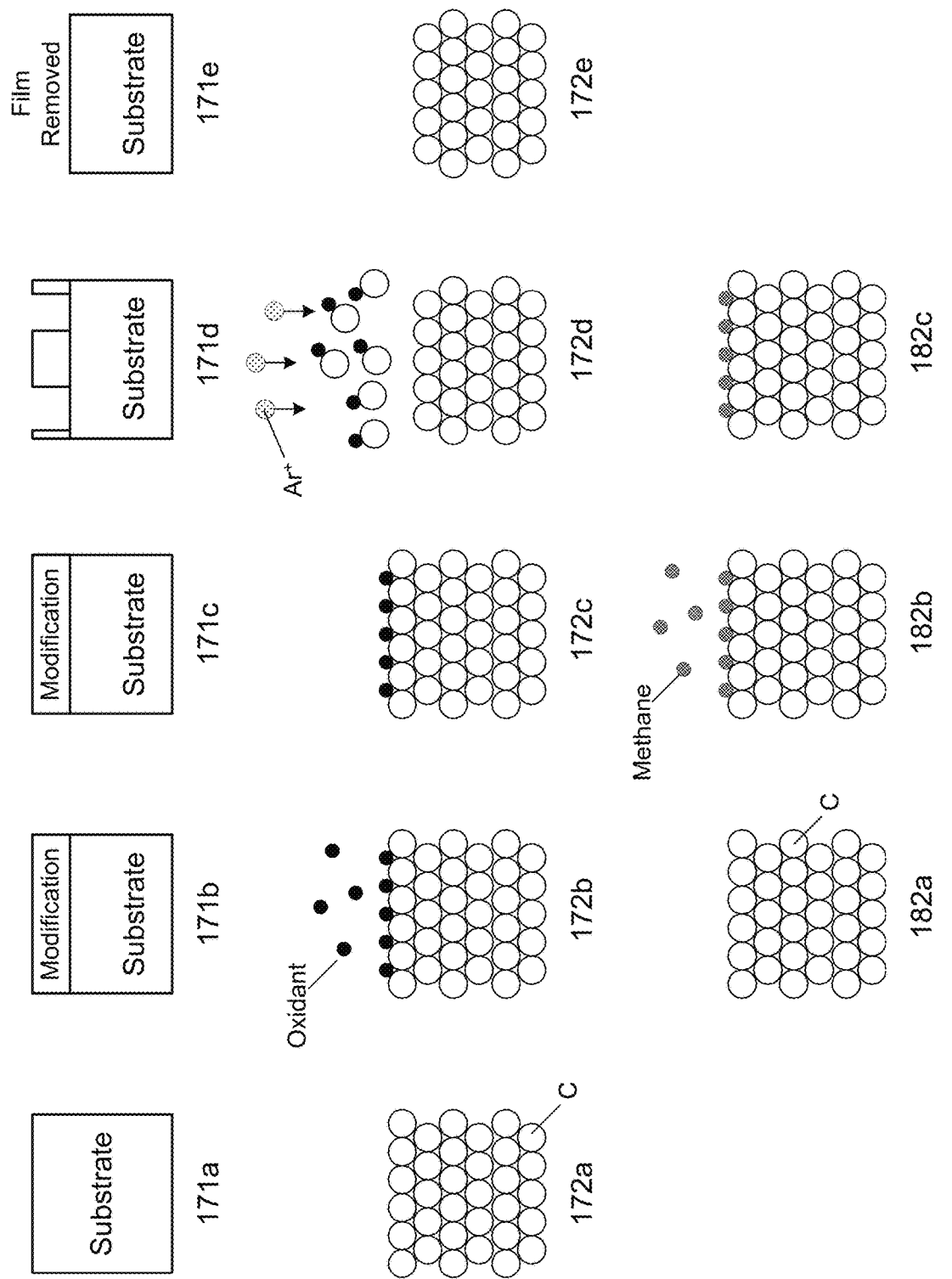
FIG. 1 is a schematic illustration of an example of atomic layer etching of film on a substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning of thin films in semiconductor processing is used in the manufacture and fabrication of semiconductor devices. Conventional patterning involves photolithography, such as 193 nm lithography. In photolithography, patterns are printed by emitting photons from a photon source onto a mask and printing the pattern onto a photosensitive photoresist, thereby causing a chemical reaction in the photoresist that removes certain portions of the photoresist to form the pattern. As devices shrink, the need for printing smaller features increases. Although multiple patterning techniques have been developed for use with conventional photolithography, multiple patterning uses multiple layers of deposition and etching processes. Scaling of features on advanced semiconductor integrated circuits (ICs) and other devices has driven lithography to improve resolution by moving to ever smaller imaging source wavelengths.

Extreme ultraviolet (EUV) lithography has been developed to print smaller patterns on a photoresist using EUV light sources at approximately 13.5 nm wavelength in leading-edge lithography tools, which are also referred to as scanners. Although next generation EUV was first expected in 2006 to support 45 nm technology node manufacturing, such developments have been long delayed due to several productivity issues. One challenge in EUV productivity has been generating sufficient power to perform patterning due to the inherent difficulty creating and focusing 13.5 nm photons. The system throughput, and hence overall cost and productivity, is determined by the ratio of photons delivered at the wafer to the photons required to image the photoresist. Although there have been methods developed over the last decade directed to modifying the source, methods have not yet achieved a source power of 250 W for a 45 nm technology node to permit efficient use of EUV techniques. The source power used to perform EUV increases as devices shrink due to shot noise and resist blur such that to perform EUV in the 5 nm technology node, a source power of 500 W-1000 W is used to be cost competitive with existing patterning technologies.

Insufficient source power results in a loss of pattern fidelity, both in the edge roughness of patterned images as well as in the defined critical dimension, particularly for via imaging. This is due to, in addition to other reasons, the low number of photons available to image each via, stochastic variations in the number of photons in each feature and the efficiency of each photon in creating a photoacid result in random variations in hole size (also referred to as local critical dimension uniformity, or "LCDU" as referred to herein) and edge roughness (also referred to as line edge roughness, or "LER" as referred to herein).

Current techniques for patterning photoresists for small critical dimension devices includes a reactive ion etching ("ME") process to harden, smooth, and remove residue from a photoresist. However, current RIE processes are unable to address LER or LCDU. For example, photoresists that have been processed by ME may still include small stringers between features and resist scum on the bottom of features.

Provided herein are methods of etching substrates such as photoresists to generate uniformly etched and smooth edges in imaged features after photolithography. Such techniques improve both LER and LCDU as described herein. Disclosed embodiments reduce the need for using a high source power to perform EUV applications, thereby improving EUV scanner productivity. Disclosed embodiments are suitable for etching substrates to form structures such as contacts to a source/drain region, 3-D contact holes, and more.

Methods involve atomic layer etching (ALE) and selective deposition to gently etch and smooth material such as carbon-containing material. Example carbon-containing material that may be etched using disclosed embodiments include photoresists (such as those used in EUV or immersion) and amorphous carbon.

ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; U.S. Pat. No. 8,808,561, issued on Aug. 19, 2014; and U.S. Pat. No. 9,576,811, issued on Feb. 21, 2017, which are herein incorporated by reference for purposes of describing example atomic layer etch and etching techniques. In various embodiments, ALE may be performed with plasma, or may be performed thermally.

ALE may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas (adsorption), (ii) purging of the reactant gas from the chamber, (iii) delivery of a removal gas and an optional plasma (desorption), and (iv) purging of the chamber.

FIG. 1 shows two example schematic illustrations of an ALE cycle and a schematic illustration of selective polymer deposition. Diagrams 171a-171e show an example ALE cycle. In 171a, the substrate is provided.

In various embodiments, the substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a blanket layer of silicon, such as amorphous silicon, or a blanket layer of germanium. The substrate may include a patterned mask layer previously deposited and patterned on the substrate. For example, a mask layer may be deposited and patterned on a substrate including a blanket amorphous silicon layer. In some embodiments, the substrate surface includes a photoresist, or graphene, or amorphous carbon.

In some embodiments, the layers on the substrate may be patterned. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench defined by a line or space in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the surface of the substrate may include more than one type of material, such as if the substrate is patterned. The substrate includes at least one material to be etched and smoothened using disclosed embodiments. This material may be any of those described above—metals, dielectrics, semiconductor materials, and others. In various embodiments, these materials may be prepared for fabricating contacts, vias, gates, etc. In some embodiments, the material to be etched is a hard mask material, such as amorphous carbon. Further example materials include aluminum gallium nitride, silicon, gallium nitride, tungsten, and cobalt.

In 171b, the surface of the substrate is modified. In 171c, the modified layer remains after a purge operation to remove excess non-adsorbed precursor. In 171d, the modified layer is being etched. In 171e, the modified layer is removed.

Similarly, diagrams 172a-172e show an example of an ALE cycle for etching a carbon-containing film. In 172a, a substrate including carbon-containing material is provided, which includes many carbon atoms. In various embodiments, the substrate includes a carbon-containing layer such as a photoresist or amorphous carbon layer.

In 172b, an oxidant is introduced to the substrate which modifies the surface of the substrate. The oxidant may be a strong oxidant such as oxygen ($O_2$) or a weak oxidant such as carbon dioxide ($CO_2$). The selection of oxidants may depend on the type of carbon-containing material on the substrate. For example, in some embodiments, a strong oxidant may be an oxidant suitable to etch hard carbon-containing material, such as amorphous carbon or graphene. In another example, in some embodiments, a weak oxidant may be an oxidant suitable for etching photoresists patterned by EUV (extreme ultraviolet) lithography or immersion lithography.

The schematic in 172b shows that some oxidant is adsorbed onto the surface of the substrate as an example. The modification operation forms a thin, reactive surface layer with a thickness that is more easily removed than the un-modified material in the subsequent removal operation. For etching a carbon-containing material, an oxygen-containing plasma may be used during the modification or adsorption operation. Oxygen-containing plasma may be generated by flowing an oxygen-containing modification chemistry such as oxygen ($O_2$) or a weak oxidant such as carbon dioxide ($CO_2$) and igniting a plasma. Additional weak oxidants include carbon monoxide (CO), nitrogen oxide (NO), and sulfur dioxide ($SO_2$). Additional reactants may include nitrogen, hydrogen, and ammonia compounds and species which can be reactively bound to the resist surface and subsequently volatized using a sub-sputter threshold ion bombardment. These strong and weak oxidants may be used by themselves or in combination, including with diluent inert gases such as helium (He), argon (Ar), neon (Ne), krypton (Kr), xenon (Xe), and combinations thereof. This operation modifies a few angstroms of the carbon-containing material surface to form a modified layer having weaker bond energies than bulk carbon-containing material. In various embodiments, the weak oxidant is provided to the substrate as a plasma with no or a low bias. For example, in various embodiments, the weak oxidant is introduced to a plasma processing chamber and a plasma source power is turned on to ignite a plasma to facilitate adsorption of the weak oxidant onto the surface of the carbon-containing material. The bias may be applied at a low power or voltage, such as a self-bias between about 5V and about 15V or up to about 50V. The plasma power may be set at a power between about 15 W and about 300 W. It will be understood that the terms "bias power" and "bias voltage" are used interchangeably herein to describe the voltage for which a pedestal is set when a bias is applied to the pedestal. Bias power or bias voltage as described herein is measured in volts, which are indicated by the unit "V" or "Vb", where b refers to bias.

In 172c, the weak oxidant is purged from the chamber. In 172d, a removal gas argon is introduced with a directional plasma as indicated by the Ar+ plasma species and arrows, and ion bombardment is performed to remove the modified carbon surface of the substrate. During this operation, a bias is applied to the substrate to attract ions toward it. In the desorption operation, an inert gas plasma (such as He, Ar, Xe, or $N_2$) may be used to remove the modified layer. Although argon is depicted in 172d, it will be understood that any suitable inert gas may be used to generate a plasma for this operation. The bias power applied during removal may be between about 30V and about 100V in various embodiments. The bias power may be selected such that the energy provided to the substrate is less than the energy required to sputter the substrate but greater than the energy used to remove the modified layer from the substrate. The plasma power may be set at a power between about 30 W and about 500 W.

In 172e, the chamber is purged and the byproducts are removed. In various embodiments, between about 1 Å and about 130 Å of material may be removed in one cycle. If a stronger oxidant is used, the etch rate may be greater than if a weaker oxidant is used. For example, for a strong oxidant such as oxygen ($O_2$) the inert plasma gas may be Ar, and about 10 Å to about 30 Å of resist material may be removed. In some embodiments, if the weak oxidant used is carbon dioxide and the inert gas plasma used to remove the modified layer is helium, each cycle may etch between about 2 Å and 3 Å of material. The post etch surface of the carbon-containing material is typically smooth after an ALE process. For example, in some embodiments, the root mean square roughness of the surface after an ALE process may be less than about 0.5 nm (Rrms<0.5 nm).

Figure 2:
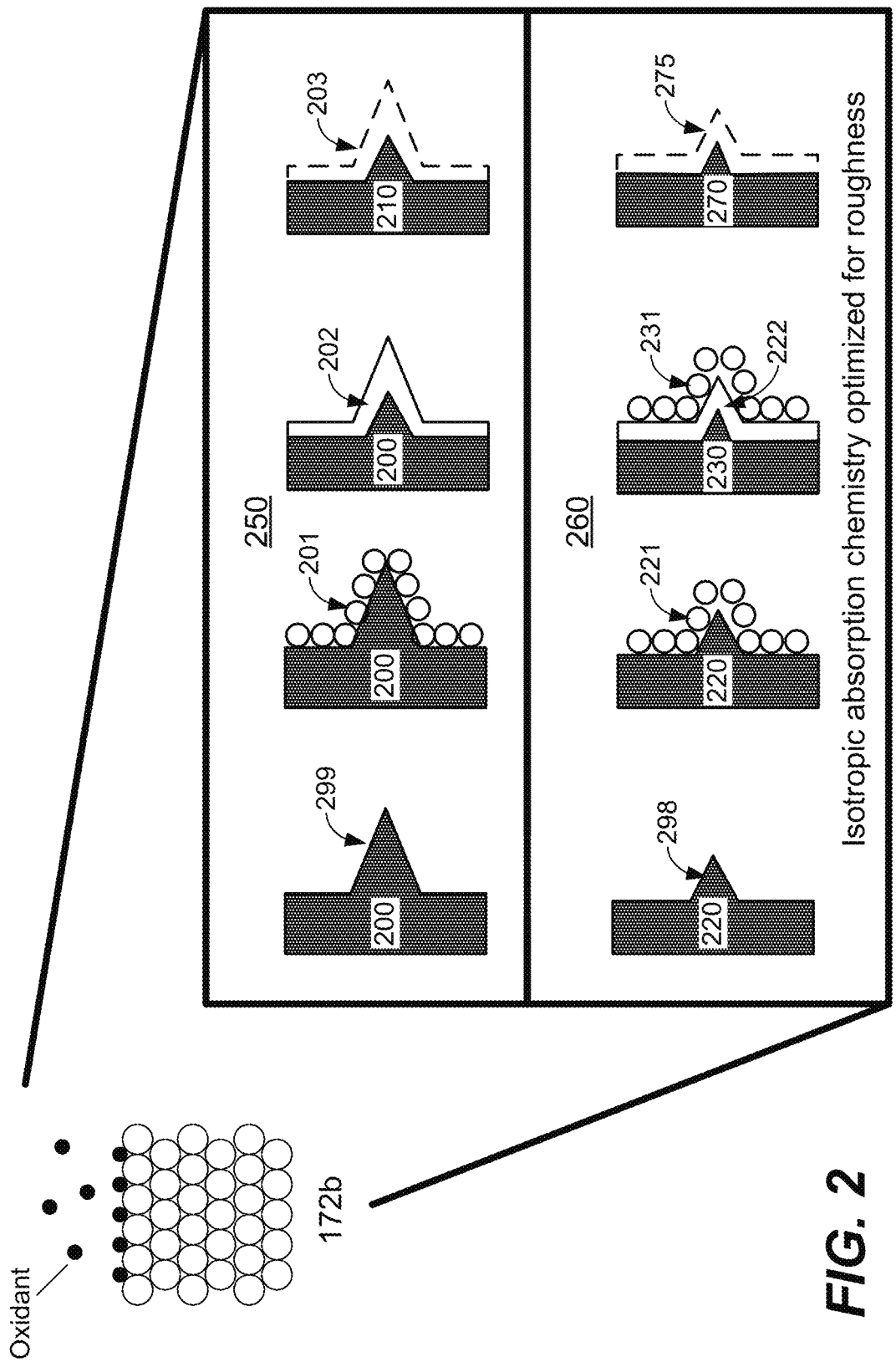
FIG. 2 is a schematic illustration of an example of performing atomic layer etching on a resist with a protrusion.

FIG. 2 shows how this operation can reduce the presence of protrusions on a photoresist. The size of protrusions on a photoresist may be between about 1 Å and about 30 Å in diameter and/or in height. An example substrate 200 having resist material and a protrusion 299 is provided. The weak oxidant 201 is provided and adsorbs onto the substrate 200, which modifies the surface of the substrate 200 to form modified surface 202. The modified surface 202 is then removed; the dotted line 203 shows where the previous carbon-containing material was on the substrate 200 to now yield substrate 210. This process 250 may constitute one ALE oxidation cycle. Process 260 shows a substrate 220 having a protrusion 298, which is exposed to a weak oxidant 221. The weak oxidant 221 adsorbs onto the substrate 220 which modifies the surface of the substrate 220 to form modified surface 222. Weak oxidant 231 adsorbs onto substrate 230 to form a modified layer (not shown) and the modified layer is further removed to yield substrate 270, which includes a dotted line 275 showing where the previous carbon-containing material was on the substrate 230.

Without being bound by a particular theory, it is believed that the scale of protrusions is on the atomic level such that since protrusions have a greater surface to volume ratio, when the carbon-containing material is adsorbed onto the surface of the protrusion and a monolayer or two of the protrusion is removed, the size of the protrusion is substantially reduced relative to material removal from an adjacent relatively flat portion of the surface. This may be due to more carbon-containing material being adsorbed onto the greater surface area provided by the protrusion.

Figure 3:
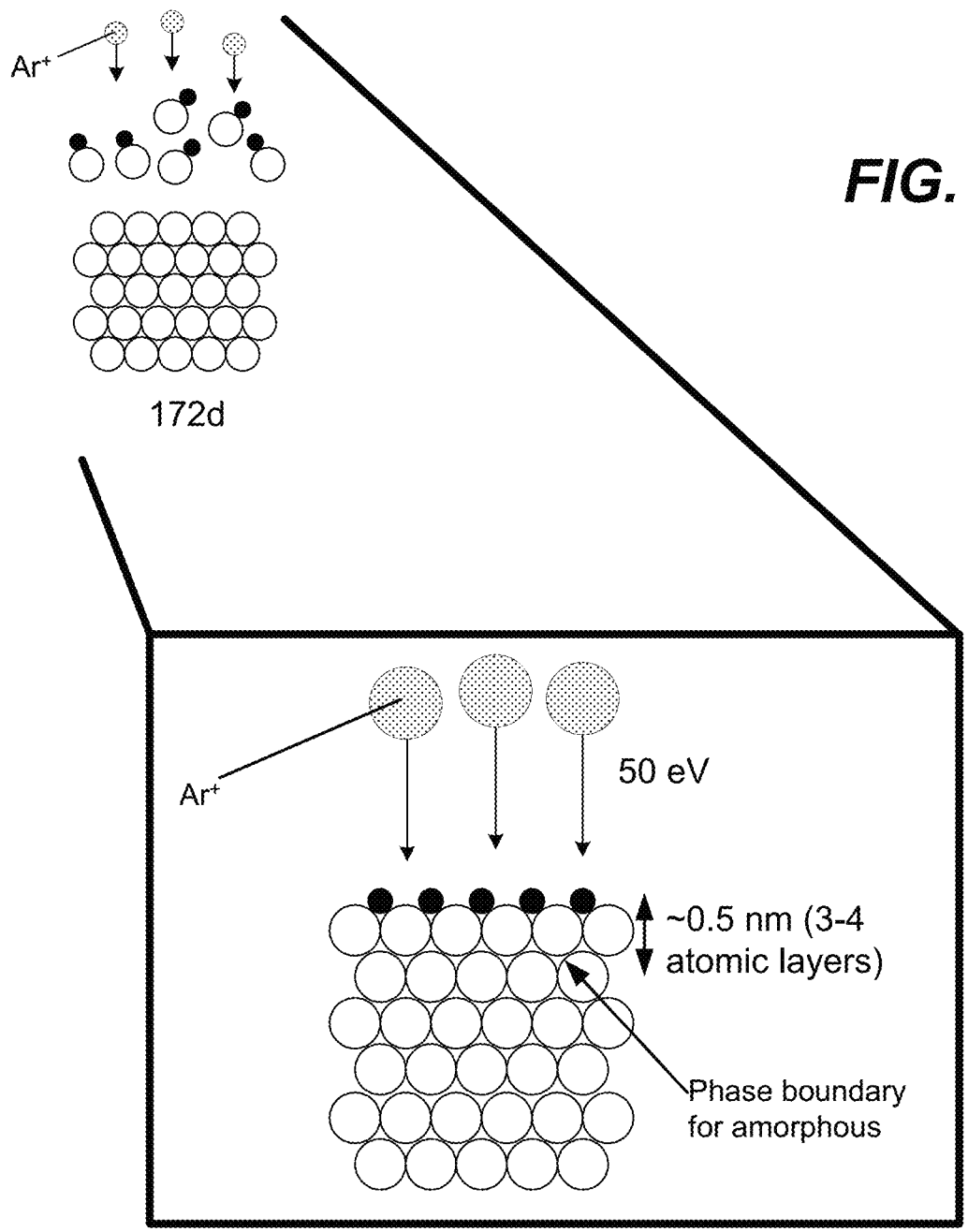
FIG. 3 is a schematic illustration of an example of a removal operation during atomic layer etching.

FIG. 3 shows how the removal operation can improve smoothing of the material being etched. The inert plasma species is used in 172d with a low bias such that the plasma species has enough energy to remove the modified surface of weak oxidant adsorbed to carbon atoms on the surface of the substrate but does not have enough energy to sputter the underlying non-modified carbon atoms from the surface of the substrate. In various embodiments, the bias may be between about 30V and about 100V, or less than about 50V. In some embodiments, the modified layer may be about 0.5 nm thick, which may include about 3 to 4 atomic layers. In some embodiments there may be a phase boundary between the modified layer and the amorphous material as shown in FIG. 3. The inert plasma species, such as Ar+ shown in FIG. 3, may be a sub-threshold, non-reactive ion species, where sub-threshold means the energy of the inert plasma species is insufficient to sputter the material underlying the modified layer but high enough to remove the modified layer. A threshold bias power or threshold bias voltage refers to the maximum voltage of the bias applied to a pedestal before material on the surface of a substrate on the pedestal is sputtered. The threshold bias power therefore depends in part on the material to be etched, the gas used to generate plasma, plasma power for igniting the plasma, and plasma frequency. After each cycle, the surface may be "reset" such that surface includes material to be removed without much or any modified material on the surface.

Further description about smoothening substrates using ALE techniques is described in U.S. Provisional Patent Application No. 62/214,813, entitled "ALE SMOOTHNESS: IN AND OUTSIDE SEMICONDUCTOR INDUSTRY" filed on Sep. 4, 2015, and U.S. Patent Application Publication No. 2017/0069462, filed Aug. 31, 2016 and entitled "ALE SMOOTHNESS: IN AND OUTSIDE SEMICONDUCTOR INDUSTRY", which are herein incorporated by reference in their entireties. Without being bound by a particular theory, it is believed that substrates may be smoothened by disclosed embodiments due to the layer-by-layer mechanism by which ALE etches material, thereby etching and smoothening protrusions on a surface of the substrate during each cycle. For example, a protrusion on the surface of material to be smoothened may be modified and etched on the surfaces of the protrusions such that as the protrusion is etched, the size of the protrusion shrinks with each etching cycle, thereby smoothening the surface of the material.

Although ALE processes can smooth sidewall or line edge roughness, it cannot change CD variation e.g. line width or hole/pillar diameters. To do this, a selective carbon-containing material deposition process is used to selectively deposit on photoresist structures and preferentially fill features with carbon-containing materials at different deposition rates into features of different sizes. In various embodiments, the diameters of holes or pillars are uniform over the substrate and LCDU is improved. For example, methane ($CH_4$) may be used in some embodiments.

Returning to FIG. 1, 182a-182c show an example schematic illustration of selective deposition processes that may be performed in accordance with certain disclosed embodiments. For the selective polymer deposition, 182a shows a substrate with carbon atoms. In 182b, the carbon is exposed to a carbon-containing chemistry such as methane ($CH_4$) such that carbon material selectively deposits onto the surface of the substrate. Although methane is shown as an example, other carbon-containing chemistries can be used which may have a chemical formula of $C_xH_y$, where x and y are integers greater than or equal to 1. Selective carbon deposition may be performed with low bias (e.g., self-bias power=about 5V to about 15V) and low RF plasma power in the range of about 30 W to about 500 W. In some embodiments, the carbon-containing chemistry may be combined with one or more diluents to generate a plasma. Example diluents include nitrogen, helium, argon, hydrogen, and combinations thereof. In 182c, the chamber is purged to remove excess polymer. The polymer remains on the surface of the carbon substrate.

Figure 4:
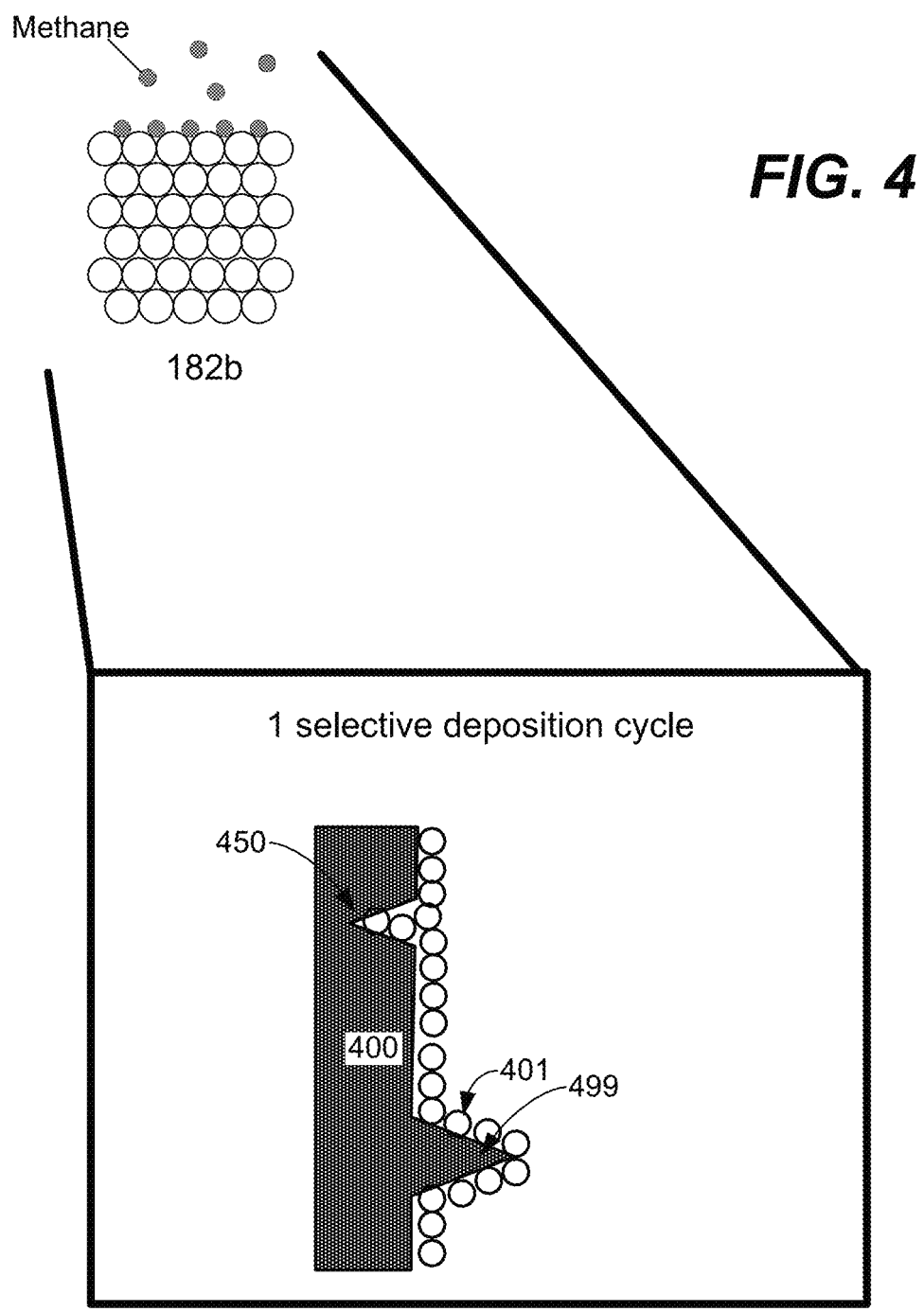
FIG. 4 is a schematic illustration of a selective deposition cycle that may be used in accordance with certain disclosed embodiments.

FIG. 4 shows how selective polymer deposition can reduce the presence of crevices and protrusions on a photoresist. During 182b, the carbon-containing chemistry, such as methane, is delivered to the substrate and adsorbs to the surface of the carbon-containing material on the substrate. In various embodiments, where there are crevices, such as the crevice 450 shown in the photoresist substrate 400 of FIG. 4, deposition of a carbon-containing material 401 using a self-limiting process as described herein fills in these crevices 450 with carbon-containing material, thereby smoothening the surface. As shown in FIG. 4, selective deposition may also include deposition on protrusions (499), such as on a photoresist. Without being bound by a particular theory, it is believed that since the scale of the crevices on the surface of the carbon-containing material may be on the atomic level, depositing a carbon-containing material into these crevices such that carbon-containing material is adsorbed uniformly onto the surface of the substrate will result in more material being deposited in a crevice than on the adjacent relatively flat surface of the substrate, thereby reducing the presence of crevices with each deposition cycle.

In some embodiments, the substrate may also be exposed to an inert plasma after exposing the substrate to the carbon-containing chemistry. The inert plasma may be generated by flowing any one or more of hydrogen, helium, nitrogen, argon, and neon and igniting a plasma. The plasma may be ignited using a plasma power between about 30 W and about 500 W. Without being bound by a particular theory, it is believed that exposing the substrate to the inert plasma allows the adjacent surface to the carbon-containing material on the substrate such as a photoresist to be slightly etched and/or refreshed to prevent deposition, hence resulting in selective deposition. Exposures to the carbon-containing chemistry and inert plasma may be performed in one or more cycles.

Using a combination of ALE techniques as described herein and selective deposition, carbon-containing materials on a substrate may be processed to result in smoothened, uniform features, particularly for EUV applications.

Figure 5:
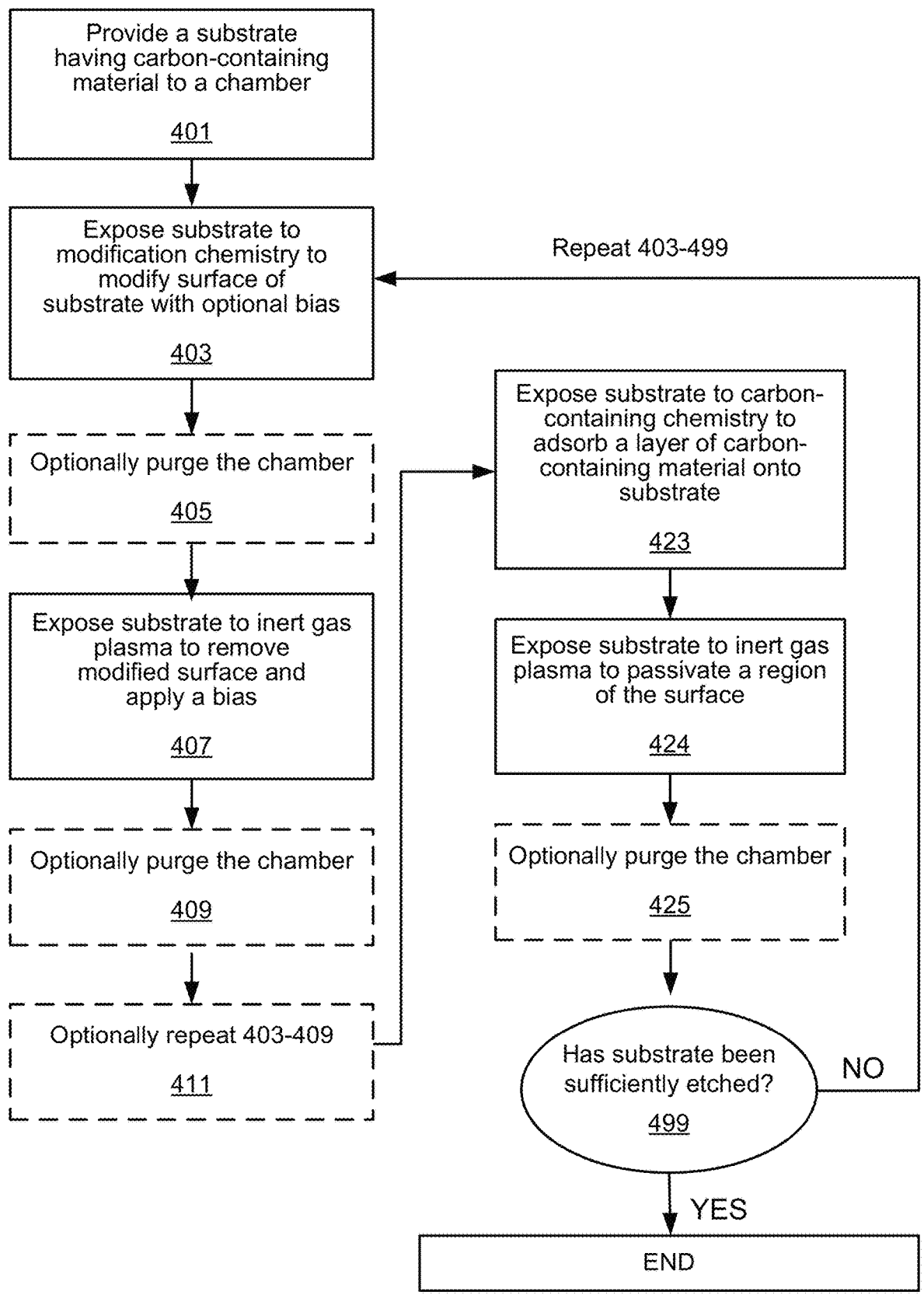
FIG. 5 is a process flow diagram of operations performed in accordance with disclosed embodiments.

FIG. 5 is a process flow diagram of an embodiment whereby ALE and selective carbon deposition are performed. Operations of FIG. 5 may be performed in a chamber having a chamber pressure between about 5 mTorr and about 100 mTorr. Operations of FIG. 5 may be performed at a substrate temperature between about 0° C. and about 120° C. or between about 20° C. and about 60° C. Substrate temperature will be understood to mean the temperature at which the pedestal or wafer holder which holds the substrate is set at. The operations shown in FIG. 5 summarize operations performed as described above with respect to FIG. 1. For example, in operation 402, a substrate including a carbon-containing material is provided to a chamber. As described above, the carbon-containing material may include a photoresist, or graphene, or amorphous carbon. Operation 402 may correspond with the schematic illustration depicted in 171a and 172a of FIG. 1. In operation 403, the substrate is exposed to a modification chemistry such as a strong or a weak oxidant to modify a surface of the substrate. In various disclosed embodiments, the carbon-containing material on the surface is modified. This operation may correspond with the schematic illustration depicted in 171b and 172b of FIG. 1 and FIG. 2. In operation 405, the chamber is optionally purged to remove excess modification chemistry (such as a weak oxidant, i.e. $CO_2$) from the chamber. This operation may correspond to 172d of FIGS. 1 and 3. The chamber may be purged by evacuating the chamber or stopping the flow of the modification chemistry and flowing a non-reactive inert gas, such as helium or argon, to remove the excess gas phase modification chemistry. In operation 407, the substrate is exposed to an inert gas plasma to remove the modified surface. During operation 407 a bias is applied to generate enough energy for the inert gas plasma to remove the modified surface without sputtering the substrate. In operation 409, the chamber is optionally purged to remove modified material in gas phase from the chamber. In operation 411, the operations 403-409 may be optionally repeated in cycles. In operation 423, the substrate is exposed to a carbon-containing chemistry to adsorb a layer of carbon-containing material onto the substrate. This may be used in some embodiments to fill crevices on the carbon-containing surface of the substrate. This operation may correspond to 182a of FIGS. 1 and 4. In operation 424, the substrate is optionally exposed to an inert gas plasma to passivate regions of the substrate and allow selective deposition in subsequent cycles. In some embodiments, the chamber may be purged between performing operations 423 and 424. In some embodiments, the substrate may be purged one or more times between performing any of the described operations. In various embodiments, operations 423 and 424 may be optionally repeated in cycles and cycles may be performed with or without purge operations between performing operations 423 and 424. In operation 425, the chamber may be optionally purged. It will be understood that purging operations as described herein may be performed by pumping gases from the chamber, by flowing one or more inert gases, or combinations thereof using any suitable purging technique. In operation 498, it is determined whether the substrate has been sufficiently etched to form the desired surface on the substrate. If not, operations 403-498 may be optionally repeated for n cycles, where n is an integer equal to or greater than 1. In some embodiments, operations 423-425 are repeated only in some but not all repeated cycles, while in some embodiments, operations 423-425 are repeated in every cycle.

By combining ALE process and the selective deposition process, both LCDU and LER of photoresist features are improved. This improvement is then transferred to an underlying hard mask (such as a $SiO_2$/SiN layer), and consequently to structures of interest resulting in improved variability and performance of the devices.

The ALE operations are gentle and precise which removes a digital amount of material per cycle so can be easily controlled to not overetch the soft resist material. Similarly, the carbon-based selective deposition uses very low source power (e.g., transformer couple plasma or TCP) and no bias, and deposition can be performed without damaging the resist.

In some embodiments, selective carbon deposition may be optional. For example, these certain embodiments may be used in applications where critical dimension increase can be tolerated.

In certain embodiments, a combination of disclosed ALE operations and selective carbon deposition may be used on a carbon-containing material to improve LCDU and recover the critical dimension if the original critical dimension is to be maintained throughout a patterning process using a photoresist.

Apparatus

Disclosed embodiments may be performed in any suitable etching chamber or apparatus, such as the Kiyo® FX, available from Lam Research Corporation of Fremont, Calif. Another example of a plasma etch chamber that may be employed is a Flex™ reactive ion etch tool available from Lam Research Corp. of Fremont, Calif. Further description of plasma etch chambers may be found in U.S. Pat. Nos. 6,841,943 and 8,552,334, which are herein incorporated by reference in their entireties.

In some embodiments, an inductively coupled plasma (ICP) reactor may be used. One example is provided in FIG. 6. Such ICP reactors have also been described in U.S. Pat. No. 9,362,133 issued Jun. 7, 2016, filed Dec. 10, 2013, and titled "METHOD FOR FORMING A MASK BY ETCHING CONFORMAL FILM ON PATTERNED ASHABLE HARDMASK," hereby incorporated by reference for the purpose of describing a suitable ICP reactor for implementation of the techniques described herein. Although ICP reactors are described herein, in some embodiments, it should be understood that capacitively coupled plasma reactors may also be used. An example etching chamber or apparatus may include a chamber having chamber walls, a chuck for holding a substrate or wafer to be processed which may include electrostatic electrodes for chucking and dechucking a wafer and may be electrically charged using an RF power supply, an RF power supply configured to supply power to a coil to generate a plasma, and gas flow inlets for inletting gases as described herein. For example, modification chemistry gases and/or selective deposition chemistry may be flowed to the etching chamber for performing ALE and/or selective deposition respectively. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., weak oxidant gas, carbon-containing gas, etc.); bias power, temperature, vacuum settings; and other process conditions. The chamber may also be used to selectively deposit carbon-containing material onto a substrate.

Figure 6:
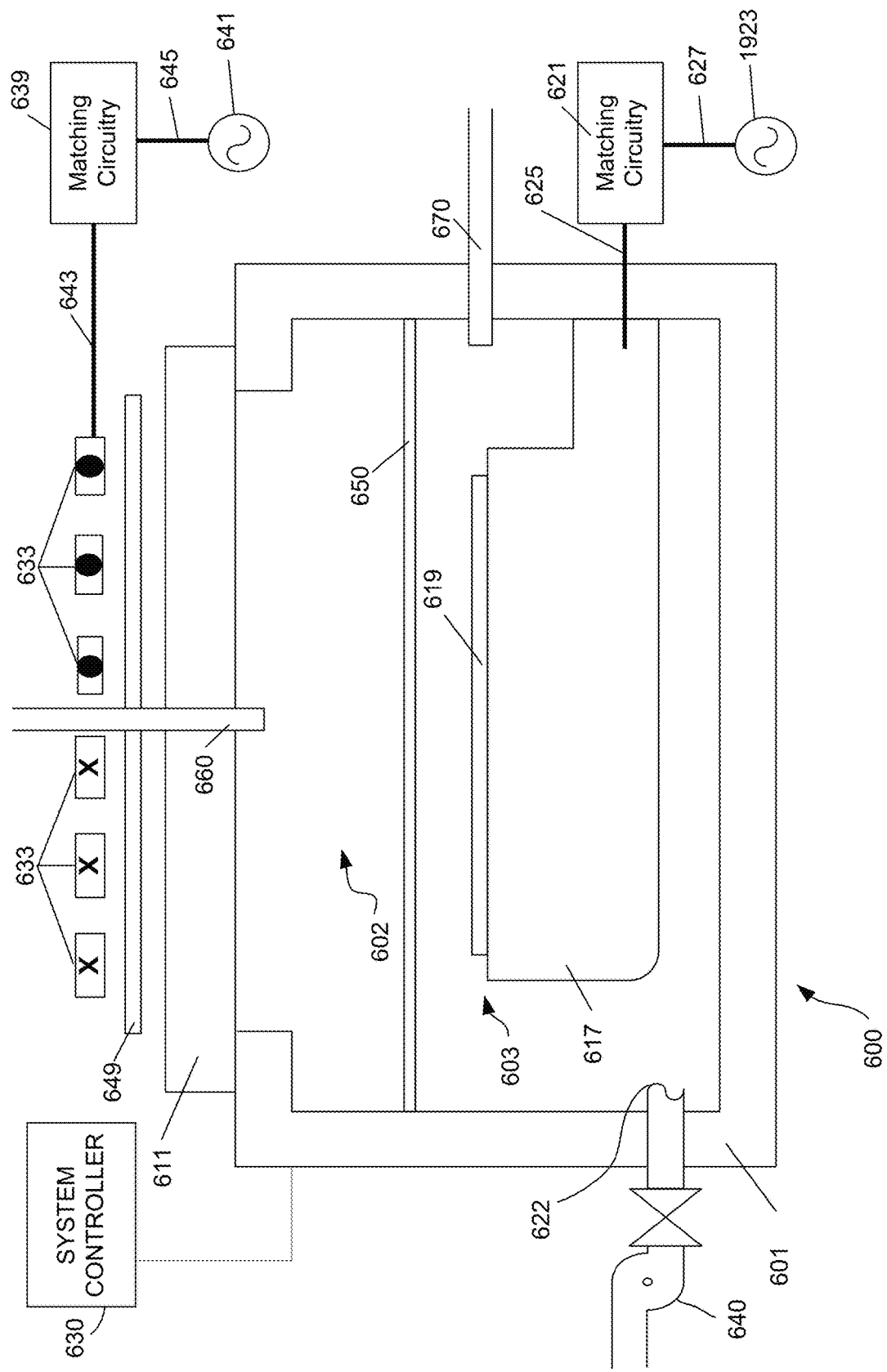
FIG. 6 is a schematic diagram of an example process chamber for performing certain disclosed embodiments.

FIG. 6 schematically shows a cross-sectional view of an inductively coupled plasma integrated etching and deposition apparatus 600 appropriate for implementing certain embodiments herein, an example of which is a Kiyo™ reactor, produced by Lam Research Corp. of Fremont, Calif. The inductively coupled plasma apparatus 600 includes an overall process chamber 601 structurally defined by chamber walls and a window 611. The chamber walls may be fabricated from stainless steel or aluminum. The window 611 may be fabricated from quartz or other dielectric material. An optional internal plasma grid 650 divides the overall processing chamber 601 into an upper sub-chamber 602 and a lower sub-chamber 603. In most embodiments, plasma grid 650 may be removed, thereby utilizing a chamber space made of sub-chambers 602 and 603. A chuck 617 is positioned within the lower sub-chamber 603 near the bottom inner surface. The chuck 617 is configured to receive and hold a semiconductor wafer 619 upon which the etching and deposition processes are performed. The chuck 617 can be an electrostatic chuck for supporting the wafer 619 when present. In some embodiments, an edge ring (not shown) surrounds chuck 617, and has an upper surface that is approximately planar with a top surface of a wafer 619, when present over chuck 617. The chuck 617 also includes electrostatic electrodes for chucking and dechucking the wafer. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

Elements for plasma generation include a coil 633 is positioned above window 611. In some embodiments, a coil is not used in disclosed embodiments. The coil 633 is fabricated from an electrically conductive material and includes at least one complete turn. The example of a coil 633 shown in FIG. 6 includes three turns. The cross-sections of coil 633 are shown with symbols, and coils having an "X" extend rotationally into the page, while coils having a "●" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield may prevent metal or other species from depositing on the dielectric window of the plasma chamber 601.

Process gases (e.g. oxygen, carbon dioxide, methane, etc.) may be flowed into the processing chamber 601 through one or more main gas flow inlets 660 positioned in the upper sub-chamber 602 and/or through one or more side gas flow inlets 670. Likewise, though not explicitly shown, similar gas flow inlets may be used to supply process gases to a capacitively coupled plasma processing chamber. A vacuum pump, e.g., a one or two stage mechanical dry pump and/or turbomolecular pump 640, may be used to draw process gases out of the process chamber 601 and to maintain a pressure within the process chamber 601. For example, the pump may be used to evacuate the chamber 601 during a purge operation of ALD. A valve-controlled conduit may be used to fluidically connect the vacuum pump to the processing chamber 601 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 660 and/or 670. In certain embodiments, process gas may be supplied only through the main gas flow inlet 660, or only through the side gas flow inlet 670. In some cases, the gas flow inlets shown in the figure may be replaced more complex gas flow inlets, one or more showerheads, for example. The Faraday shield 649 and/or optional grid 650 may include internal channels and holes that allow delivery of process gases to the chamber 601. Either or both of Faraday shield 649 and optional grid 650 may serve as a showerhead for delivery of process gases. In some embodiments, a liquid vaporization and delivery system may be situated upstream of the chamber 601, such that once a liquid reactant or precursor is vaporized, the vaporized reactant or precursor is introduced into the chamber 601 via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 selectively etch features of and deposit layers on the wafer.

If the plasma grid is used such that there is both an upper sub-chamber 602 and a lower sub-chamber 603, the inductive current acts on the gas present in the upper sub-chamber 602 to generate an electron-ion plasma in the upper sub-chamber 602. The optional internal plasma grid 650 limits the amount of hot electrons in the lower sub-chamber 603. In some embodiments, the apparatus is designed and operated such that the plasma present in the lower sub-chamber 603 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 603 through port 622. The chuck 617 disclosed herein may operate at elevated temperatures ranging between about 10° C. and about 250° C. The temperature will depend on the process operation and specific recipe.

Chamber 601 may be coupled to facilities (not shown) when installed in a clean room or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that allows robotics to transfer semiconductor wafers into and out of chamber 601 using typical automation.

In some embodiments, a system controller 630 (which may include one or more physical or logical controllers) controls some or all of the operations of a processing chamber. The system controller 630 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

The processing chamber 601 or apparatus may include a system controller. For example, in some embodiments, a controller 630 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 630, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 630 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 630, in some implementations, may be a part of or coupled to a computer that is integrated with, coupled to the system, otherwise networked to the system, or a combination thereof. For example, the controller 630 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 630 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 7:
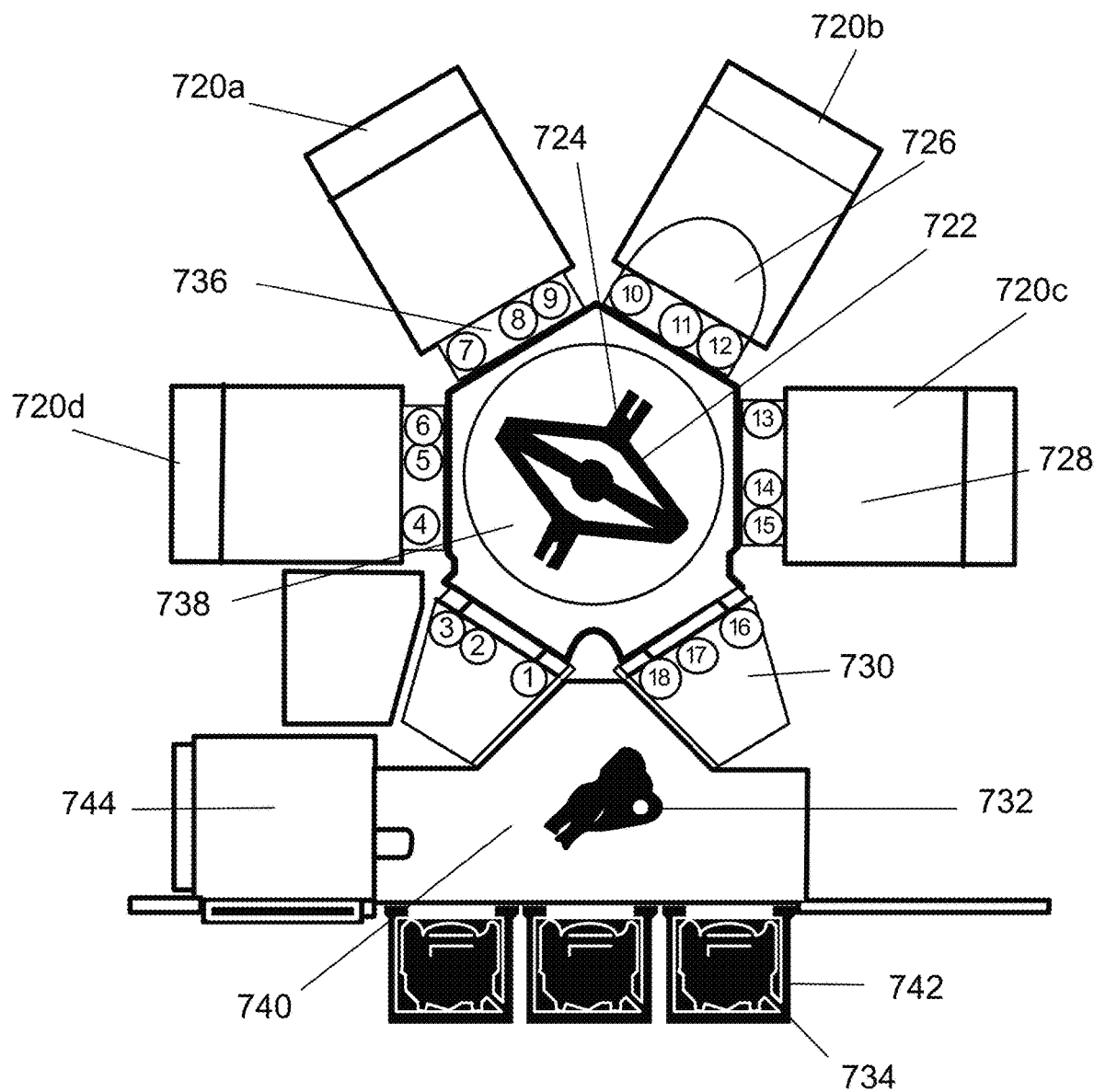
FIG. 7 is a schematic diagram of an example process apparatus for performing certain disclosed embodiments.

The processing chamber 601 may be integrated in a multi-station tool such as shown in FIG. 7. Each station may be used to process different operations. For example, one station may be used to perform ALE while another station is used to perform selective deposition. Disclosed embodiments may be performed without breaking vacuum and may be performed in the same apparatus. In various embodiments, ALE and selective deposition are performed without breaking vacuum. In various embodiments, ALE and selective deposition are performed in the same chamber.

FIG. 7 depicts a semiconductor process cluster architecture with various modules that interface with a vacuum transfer module 738 (VTM). The arrangement of transfer modules to "transfer" wafers among multiple storage facilities and processing modules may be referred to as a "cluster tool architecture" system. Airlock module 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, wafer cleaning, sputtering, and/or other semiconductor processes. In some embodiments, ALE and selective deposition are performed in the same module. In some embodiments, ALE and selective deposition are performed in different modules of the same tool. One or more of the substrate etching processing modules (any of 720a-720d) may be implemented as disclosed herein, i.e., for performing ALE, selectively depositing carbon-containing material, and other suitable functions in accordance with the disclosed embodiments. Airlock module 730 and process module 720 may be referred to as "stations." Each station has a facet 736 that interfaces the station to VTM 738. Inside each facet, sensors 1-18 are used to detect the passing of wafer 726 when moved between respective stations.

Robot 722 transfers wafer 726 between stations. In one embodiment, robot 722 has one arm, and in another embodiment, robot 722 has two arms, where each arm has an end effector 724 to pick wafers such as wafer 726 for transport. Front-end robot 732, in atmospheric transfer module (ATM) 740, is used to transfer wafers 726 from cassette or Front Opening Unified Pod (FOUP) 734 in Load Port Module (LPM) 742 to airlock module 730. Module center 728 inside process module 720 is one location for placing wafer 726. Aligner 744 in ATM 740 is used to align wafers.

In an exemplary processing method, a wafer is placed in one of the FOUPs 734 in the LPM 742. Front-end robot 732 transfers the wafer from the FOUP 734 to an aligner 744, which allows the wafer 726 to be properly centered before it is etched or processed. After being aligned, the wafer 726 is moved by the front-end robot 732 into an airlock module 730. Because airlock modules have the ability to match the environment between an ATM and a VTM, the wafer 726 is able to move between the two pressure environments without being damaged. From the airlock module 730, the wafer 726 is moved by robot 722 through VTM 738 and into one of the process modules 720a-720d. In order to achieve this wafer movement, the robot 722 uses end effectors 724 on each of its arms. Once the wafer 726 has been processed, it is moved by robot 722 from the process modules 720a-720d to an airlock module 730. From here, the wafer 726 may be moved by the front-end robot 732 to one of the FOUPs 734 or to the aligner 744.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 6 may be implemented with the tool in FIG. 7.

EXPERIMENTAL

Experiment 1

Figure 8A:
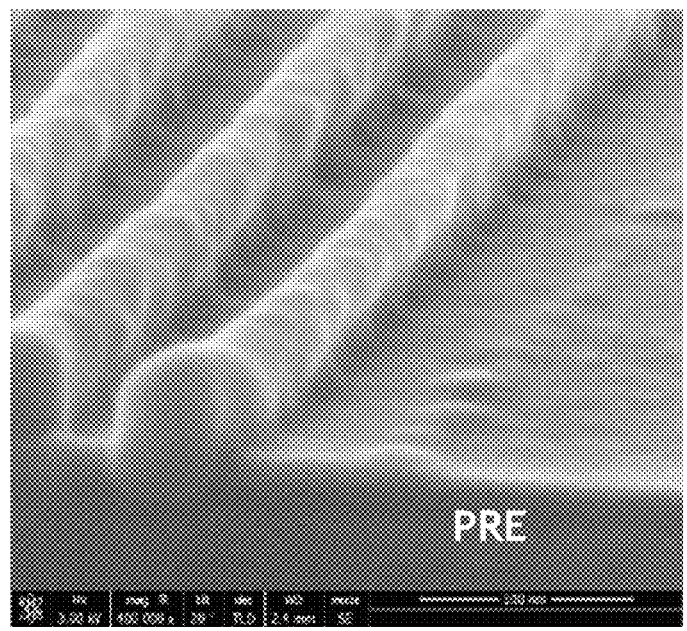
FIG. 8A is an image of a substrate used in an experiment.

An experiment was conducted on a carbon-containing photoresist. The substrate prior to etching processes is shown in FIG. 8A.

Figure 8B:
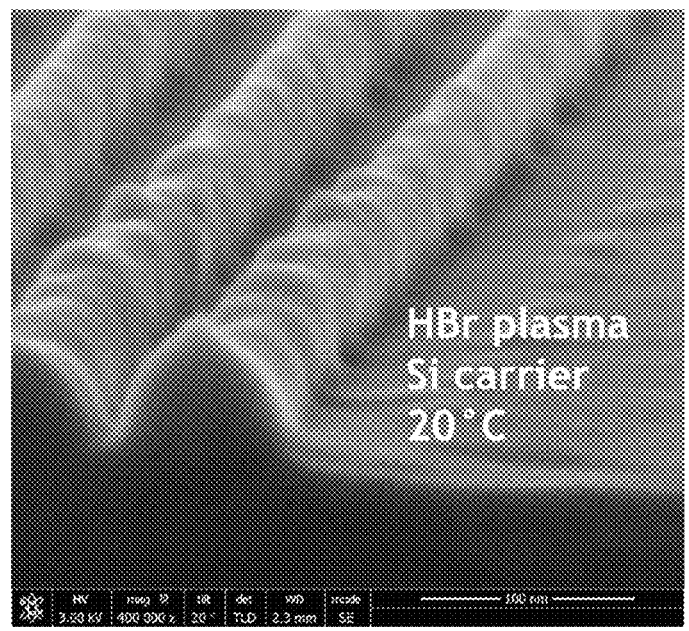
FIG. 8B is an image of a substrate from an experiment.

Conventional RIE etching is performed by exposing the substrate to HBr and a plasma power of 900 W for 15 seconds at 20° C. The resulting substrate is in FIG. 8B.

Figure 8C:
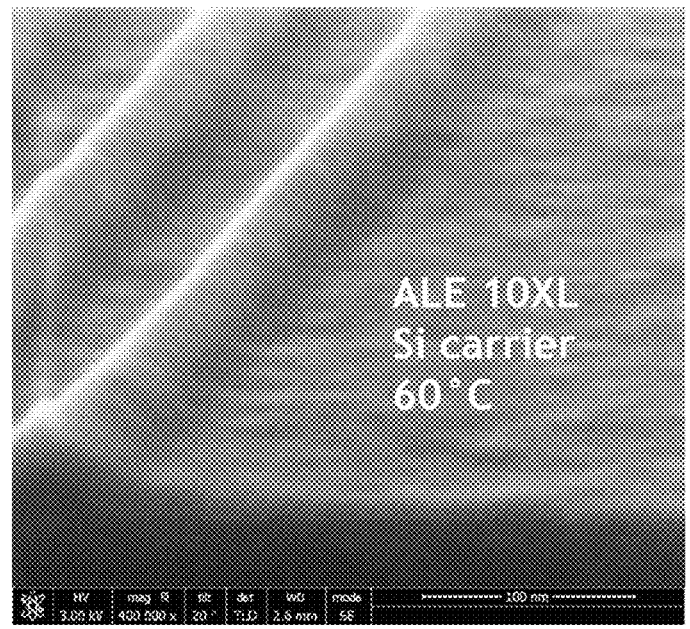
FIGS. 8C-8E are images of resulting substrates from experiments conducted in accordance with certain disclosed embodiments.

In another trial, the substrate was exposed to 10 cycles of ALE at 60° C. The operations included exposure to $CO_2$ plasma, purge, exposure to helium plasma with a low bias, and purge. The resulting photoresist has smooth sidewalls and reduced roughness, with improvement of LER. Stringers were reduced and scum of the photoresist was reduced. The resulting substrate is in FIG. 8C.

Figure 8D:
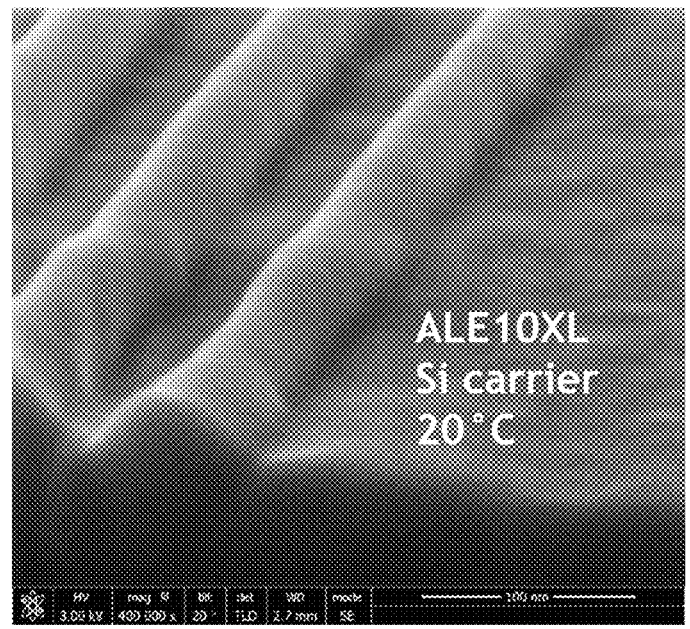

In another trial, the substrate was exposed to 10 cycles of ALE at 20° C. The operations included exposure to $CO_2$ plasma, purge, exposure to helium plasma with a low bias, and purge. The resulting substrate is shown in FIG. 8D.

Figure 8E:
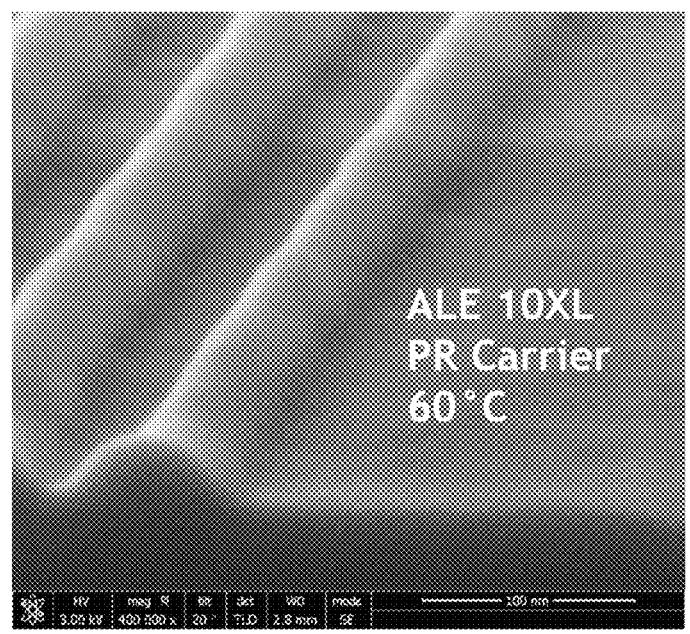

In another trial, the substrate was exposed to 10 cycles of ALE at 60° C. The operations included exposure to $CO_2$ plasma, purge, exposure to helium plasma with a low bias, and purge. The resulting substrate is shown in FIG. 8E.

Performing ALE resulted in a substrate having visibly smoother lines. These results suggest that ALE may be performed at either 20° C.

Experiment 2

Figure 9A:
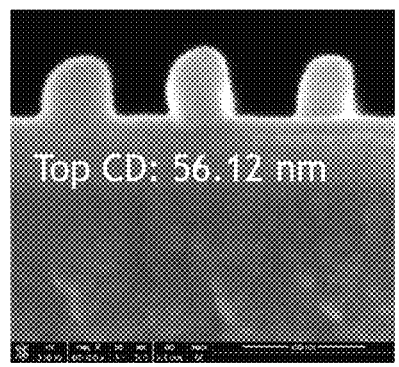
FIGS. 9A-9C are various views of substrates.
Figure 9B:
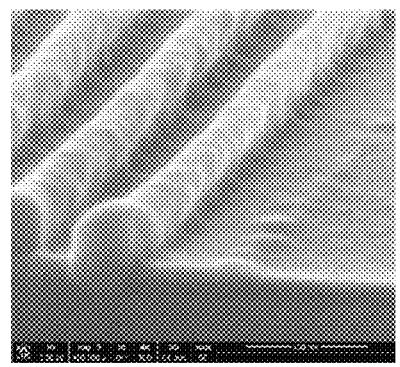
Figure 9C:
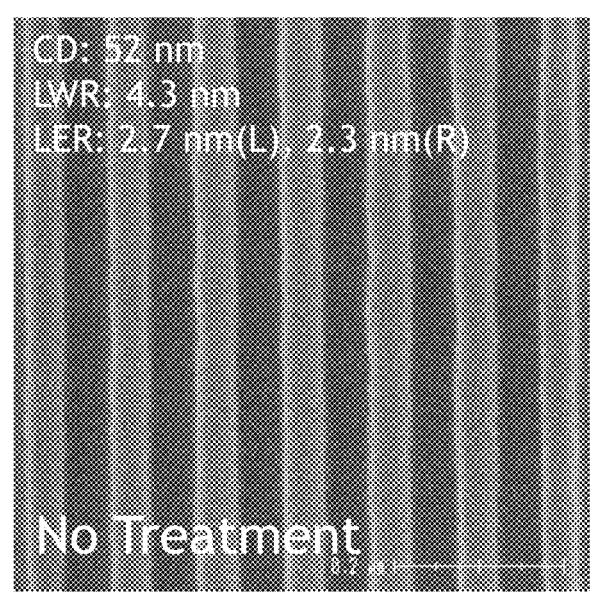

An experiment was conducted whereby ALE of a photoresist was performed for 3 cycles, and for 5 cycles. The substrate with no ALE is shown in FIGS. 9A-9C.

Figure 10A:
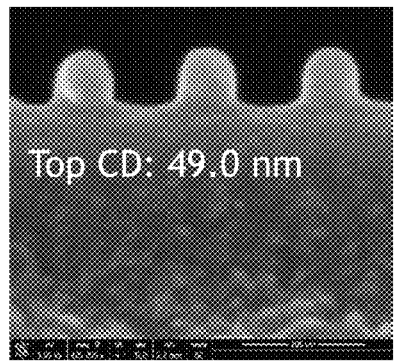
Figure 10B:
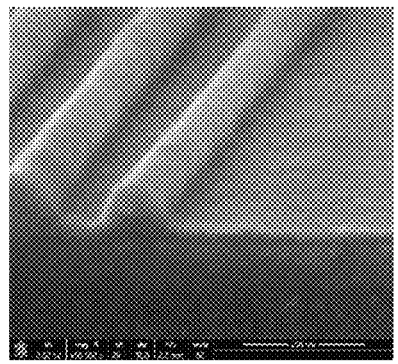
Figure 10C:
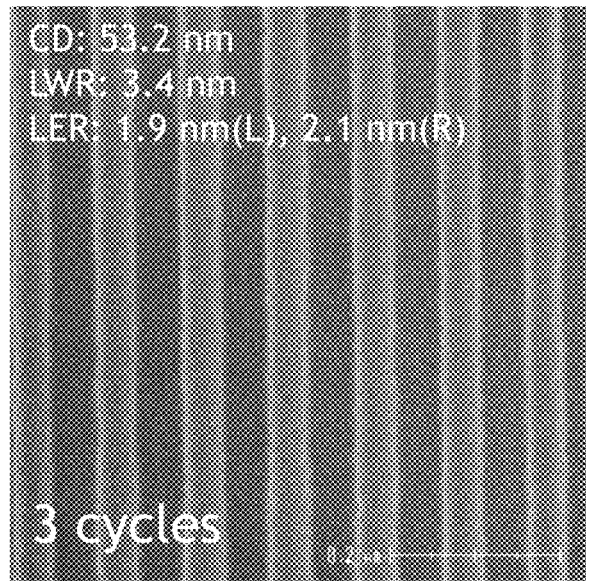

A substrate was exposed to three cycles of ALE operations which included exposure to $CO_2$ plasma, purge, exposure to helium plasma with a low bias, and purge. The substrate after 3 cycles is shown in FIGS. 10A-10C.

A substrate was exposed to five cycles of ALE operations which included exposure to $CO_2$ plasma, purge, exposure to helium plasma with a low bias, and purge. The substrate after 5 cycles is shown in FIGS. 11A-11C.

CONCLUSION

Although the foregoing embodiments have been described in some detail for purposes of clarity of understanding, it will be apparent that certain changes and modifications may be practiced within the scope of the disclosed embodiments. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing substrates, the method comprising:
    (a) exposing a substrate comprising a first carbon-containing material to an oxidant and igniting a first plasma to modify a surface of the first carbon-containing material; and
    (b) exposing the modified surface to a second plasma at a bias power and for a duration sufficient to remove the modified surface without sputtering.

2. The method of claim 1, further comprising (c) selectively depositing a second carbon-containing material on the substrate to fill crevices on the first carbon-containing material.

3. The method of claim 2, wherein selectively depositing the second carbon-containing material on the substrate comprises applying a self bias at a power between about 5V and about 15V and igniting a plasma using a plasma power between about 30 W and about 500 W.

4. The method of claim 3, wherein selectively depositing the second carbon-containing material on the substrate further comprises introducing methane.

5. The method of claim 4, wherein selectively depositing the second carbon-containing material on the substrate further comprises introducing a diluent selected from the group consisting of nitrogen, helium, argon, hydrogen, and combinations thereof.

6. The method of claim 2, wherein (c) comprises exposing the substrate to methane to adsorb a layer of methane to the surface of the first carbon-containing material and exposing the substrate to a third plasma.

7. The method of claim 1, wherein the bias power may be between about 30V and about 100V.

8. The method of claim 1, wherein the oxidant is a strong oxidant.

9. The method of claim 8, wherein the strong oxidant is oxygen.

10. The method of claim 8, wherein the first plasma is generated using a plasma power between about 15 W and about 500 W.

11. The method of claim 8, wherein the first plasma is ignited with another bias power between about 5V and 50V.

12. The method of claim 1, wherein the oxidant is a weak oxidant.

13. The method of claim 12, wherein the weak oxidant is selected from the group consisting of carbon dioxide, carbon monoxide, sulfur dioxide, nitric oxide, nitrogen, and ammonia.

14. The method of claim 12, wherein the first plasma is generated using a plasma power between about 30 W and about 500 W.

15. The method of claim 12, wherein the first plasma is ignited with another bias power between about 30V and about 100V.

16. The method of claim 1, wherein the first carbon-containing material is selected from the group consisting of photoresist, amorphous carbon, and graphene.

17. The method of claim 1, wherein the first carbon-containing material is a photoresist patterned by extreme ultraviolet lithography.

18. The method of claim 1, wherein the second plasma in (b) is generated by introducing an inert gas selected from the group consisting of hydrogen, helium, nitrogen, argon, and neon and igniting the second plasma.

19. A method of processing substrates, the method comprising:
(a) exposing a substrate comprising a first carbon-containing material to an oxidant and igniting a first plasma to modify a surface of the first carbon-containing material;
(b) exposing the modified surface to a second plasma at a bias power and for a duration sufficient to remove the modified surface without sputtering; and
(c) selectively depositing a second carbon-containing material on the substrate to fill crevices on the first carbon-containing material using a precursor having a chemical formula of $C_xH_y$, where x and y are integers greater than or equal to 1.

20. The method of claim 19, wherein the precursor comprises methane.

* * * * *